US007355890B1

(12) United States Patent
Wen

(10) Patent No.: US 7,355,890 B1
(45) Date of Patent: Apr. 8, 2008

(54) CONTENT ADDRESSABLE MEMORY (CAM) DEVICES HAVING NAND-TYPE COMPARE CIRCUITS

(75) Inventor: Tingjun Wen, Kanata (CA)

(73) Assignee: Integrated Device Technology, Inc., San Jose, CA (US)

( * ) Notice: Subject to any disclaimer, the term of this patent is extended or adjusted under 35 U.S.C. 154(b) by 0 days.

(21) Appl. No.: 11/553,202

(22) Filed: Oct. 26, 2006

(51) Int. Cl.
*G11C 16/04* (2006.01)
(52) U.S. Cl. .................... 365/185.17; 365/49; 365/104
(58) Field of Classification Search ................. 365/49, 365/185.17, 104
See application file for complete search history.

(56) References Cited

U.S. PATENT DOCUMENTS

| | | | | |
|---|---|---|---|---|
| 4,352,031 A | * | 9/1982 | Holbrook et al. ........... | 257/390 |
| 4,447,747 A | * | 5/1984 | LaPotin ..................... | 257/350 |
| 5,345,411 A | | 9/1994 | Yoneda | |
| 6,353,555 B1 | * | 3/2002 | Jeong ..................... | 365/185.11 |
| 6,650,567 B1 | * | 11/2003 | Cho et al. .............. | 365/185.17 |
| 6,760,249 B2 | | 7/2004 | Chien | |
| 7,110,275 B2 | | 9/2006 | Park | |
| 2007/0183204 A1 | * | 8/2007 | Kim et al. ............. | 365/185.17 |

OTHER PUBLICATIONS

Paglamtzis et al., "Content-Addressable Memory (CAM) Circuits and Architectures: A Tutorial and Survey," IEEE Journal of Solid-State Circuits, vol. 41, No. 3, Mar. 2008, pp. 712-727.
Choi et al., "A 0.7-fJ/Bit/Search 2.2-ns Search Time Hybrid-Type TCAM Architecture," IEEE Journal of Solid-State Circuits, vol. 40, No. 1, Jan. 2005, pp. 254-260.
Paglamtzis et al., "A Low-Power Content-Addressable Memory (CAM) Using Pipelined Hierarchical Search Scheme," IEEE Journal of Solid-State Circuits, vol. 39, No. 9, Sep. 2004, pp. 1512-1519.

* cited by examiner

*Primary Examiner*—Thong Q. Le
(74) *Attorney, Agent, or Firm*—Myers Bigel Sibley & Sajovec

(57) ABSTRACT

Content addressable memory (CAM) devices have CAM cells therein that are electrically coupled to a NAND-type compare circuit. This NAND-type compare circuit is responsive to a first operand (K) containing true and complementary bits of an applied search key and a second operand (D) containing true and complementary bits of a stored search word. The NAND-type compare circuit includes a first string of transistors connected end-to-end in series from a first terminal to a second terminal and a second string of transistors connected end-to-end in series from the first terminal to the second terminal. This first string of transistors has gate terminals responsive to the first operand and the second string of transistors has gate terminals responsive to the second operand.

8 Claims, 10 Drawing Sheets

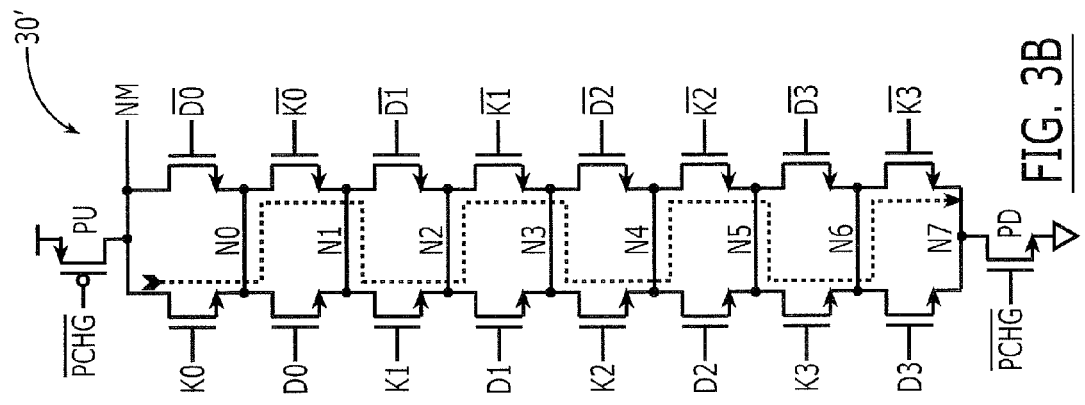
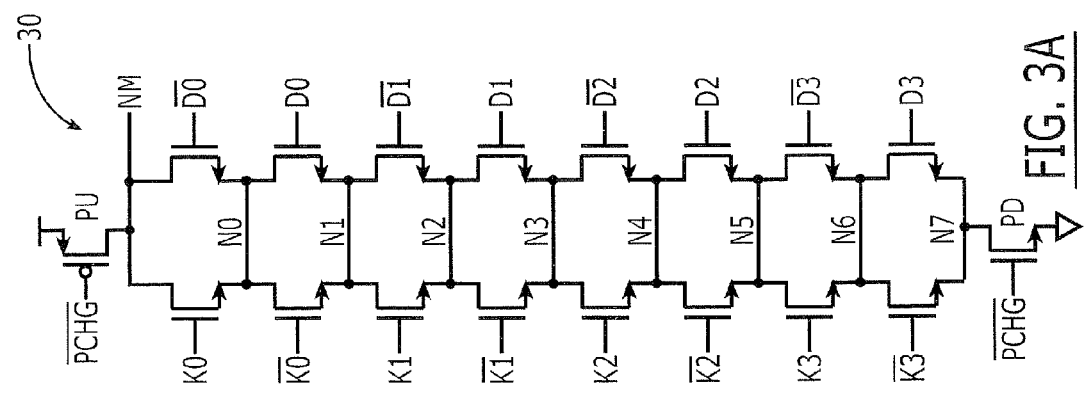
FIG. 3B
FIG. 3A

CONTENT ADDRESSABLE MEMORY (CAM) DEVICES HAVING NAND-TYPE COMPARE CIRCUITS

FIELD OF THE INVENTION

The present invention relates to integrated circuit memory devices and, more particularly, to content addressable memory (CAM) devices.

BACKGROUND OF THE INVENTION

In many memory devices, including random access memory (RAM) devices, data is typically accessed by supplying an address to an array of memory cells and then reading data from the memory cells that reside at the supplied address. However, in content addressable memory (CAM) devices, data within a CAM array is not accessed by initially supplying an address, but rather by initially applying data (e.g., search words) to the array and then performing a search operation to identify one or more entries within the CAM array that contain data equivalent to the applied data and thereby represent a "match" condition. In this manner, data is accessed according to its content rather than its address. Upon completion of the search operation, the identified location(s) containing the equivalent data is typically encoded to provide an address (e.g., block address+row address within a block) at which the matching entry is located. If multiple matching entries are identified in response to the search operation, then local priority encoding operations may be performed to identify a location of a best or highest priority matching entry. Such priority encoding operations frequently utilize the relative physical locations of multiple matching entries within the CAM array to identify a highest priority matching entry.

The cells within a CAM array are frequently configured as binary CAM cells that store only data bits (as "1" or "0" logic values) or as ternary (or quaternary) CAM cells that store data bits and mask bits. As will be understood by those skilled in the art, when a mask bit within a ternary CAM cell is inactive (e.g., set to a logic 1 value), the ternary CAM cell may operate as a conventional binary CAM cell storing an "unmasked" data bit. When the mask bit is active (e.g., set to a logic 0 value), the ternary CAM cell is treated as storing a "don't care" (*) value, which means that all compare operations performed on the actively masked ternary CAM cell will result in a cell match condition. Thus, if a logic 0 data bit is applied to a ternary CAM cell storing an active mask bit and a logic 1 data bit, the compare operation will indicate a cell match condition. A cell match condition will also be indicated if a logic 1 data bit is applied to a ternary CAM cell storing an active mask bit and a logic 0 data bit. Accordingly, if a data word of length N, where N is an integer, is applied to a ternary CAM array having a plurality of entries therein of logical width N, then a compare operation will yield one or more match conditions whenever all the unmasked data bits of an entry in the ternary CAM array are identical to the corresponding data bits of the applied search word. This means that if the applied search word equals {1011}, the following entries will result in a match condition in a CAM comprising ternary CAM cells: {1011}, {*011}, {1*11}, {10*1}, {101*}, {11}, {11}, . . . , {1*}, {**}.

A quaternary CAM cell is different from a ternary CAM cell because it has four valid combinations of states: ((data=0, mask=active), (data=1, mask=active), (data=0, mask=inactive), (data=1, mask=inactive)). Quaternary CAM cells are frequently treated as "ternary" CAM cells because two of the four states represent equivalent active mask conditions when search operations are performed. However, ternary CAM (TCAM) cells and quaternary CAM (QCAM) cells will be treated herein as separate categories of CAM cells.

CAM cells may be configured with NOR-type or NAND-type compare logic. In the case of NOR-type compare logic, a match line associated with a row of CAM cells is typically switched high-to-low upon detection of at least one "miss" in the row during a search operation. NOR-type compare logic typically provides for faster CAM cell operation during search operations with relatively high match line power consumption. Because of the parallel configuration of NOR-type compare logic, parasitic leakage currents through the compare logic transistors may provide a significant pull-down force on a match line and lead to search failure.

In contrast, in NAND-type compare logic, a match line signal is propagated across the compare logic and lower match line power is typically consumed. For example, in the conventional ternary NAND-type CAM cell 10 of FIG. 1A, a match line signal may be propagated across at least one of two parallel paths of a four transistor (4T) compare logic circuit when a match condition is present or blocked from propagation when a miss condition is present. A first one of these two parallel paths is defined by transistor NA, which is responsive to a data signal (DX) applied during a search operation, and transistor NB, which is responsive to a signal generated at a storage node of an X memory cell (SRAM SX). A second one of these two parallel paths is defined by transistor NC, which is responsive to a data signal (DY) applied during a search operation, and transistor ND, which is responsive to a signal generated at a storage node of a Y memory cell (SRAM SY).

Unfortunately, because CAM cells having the NAND-type compare logic illustrated by FIG. 1A require serial propagation of match line signals, NAND-type CAM devices are typically slower in operation relative to NOR-type CAM devices. This serial propagation of a match line signal is demonstrated by the pair of NAND-type CAM cells 10' of FIG. 1B. This pair of CAM cells 10' includes a left cell containing transistors NA1, NB1, NC1 and ND1 and a right cell containing transistors NA2, NB2, NC2 and ND2. A worst case propagation of a match line signal ML from the left of the left cell to the right of the right cell requires a propagation through four serially-connected transistors NA1, NB1 (or NC1, ND1) and NA2, NB2 (or NC2, ND2).

FIG. 2A illustrates another NAND-type CAM cell 20, which is illustrated and described more fully in U.S. Pat. No. 7,110,275 to Park, the disclosure of which is hereby incorporated herein by reference. This CAM cell 20 includes four memory cells and a ladder-type compare circuit. The four memory cells are illustrated as static random access memory (SRAM) cells (SXA, SXB, SXC and SXD). The ladder-type compare circuit contains four parallel rungs for the case where four bits of data are stored within the CAM cell 20. The first rung includes two NMOS transistors connected in series (i.e., source-to-drain). These two NMOS transistors are shown as T1 and T2. This first rung becomes conductive to thereby short a left side match line segment (MLa) to a right match line segment (MLb) when an applied data signal DXA and an output (e.g., storage node output) of the memory cell SRAM SXA are both set to logic 1 values. Similarly, the second rung of the compare circuit includes transistors T3 and T4. This second rung becomes conductive when an applied data signal DXB and an output of the memory cell SRAM SXB are both set to logic 1 values. The third rung of the compare circuit includes transistors T5 and T6. This third rung becomes conductive when an applied data signal DXC and an output of the memory cell SRAM SXC are both set to logic 1 values. The fourth rung of the compare circuit includes transistors T7 and T8. This fourth rung becomes conductive when an applied data signal DXD and an output of the memory cell SRAM SXD are both set to logic 1 values.

As illustrated by FIG. 2B, NAND-type CAM cells may be provided in a CAM system 22 having a large capacity CAM array 26 therein. The CAM array 26 may be configured to support a large number of rows and columns of NAND-type CAM cells. The data and bit lines (e.g, DXA, DXB, DXC and DXD and (BXA, BXBA), (BXB, BXBB), (BXC, BXBC) and (BXD, BXBD)) that span the CAM array 26 are electrically coupled to a bit/data line encoder and driver circuit 24. The bit lines that span the CAM array 26 may also be electrically coupled to a bit/data line decoder and buffer circuit 28, which receives data from the CAM array 26 during read operations. As illustrated, the encoder/driver circuit 34 receives input data and the decoder/buffer circuit 28 generates output data.

SUMMARY OF THE INVENTION

Embodiments of the present invention include content addressable memory (CAM) devices having CAM cells therein that are electrically coupled to a NAND-type compare circuit. This NAND-type compare circuit is responsive to a first operand (K) containing true and complementary bits of an applied search key and a second operand (D) containing true and complementary bits of a stored search word. The NAND-type compare circuit includes a first string of transistors connected end-to-end in series from a first terminal to a second terminal and a second string of transistors connected end-to-end in series from the first terminal to the second terminal. This first string of transistors has gate terminals responsive to the first operand and the second string of transistors has gate terminals responsive to the second operand. The second string of transistors has source and drain terminals connected to corresponding source and drain terminals of the first string of transistors such that each source terminal of a transistor in said second string is electrically shorted to at least one source terminal of a transistor in said first string and each drain terminal of a transistor in said second string is electrically shorted to at least one drain terminal of a transistor in said first string.

The NAND-type compare circuit may also include first and second pull-up transistors and a pull-down transistor. The first pull-up transistor is configured to precharge the first terminal of the NAND-type compare circuit in response to a first precharge signal. In contrast, the second pull-up transistor, which may be added to reduce the effects of charge sharing between internal nodes of the NAND-type compare circuit, is configured to precharge a node in the NAND-type compare circuit that is electrically connected a pair of source and drain terminals in the first string of transistors and a pair of source and drain terminals in the second string of transistors. The second pull-up transistor may also be responsive to the first precharge signal. The pull-down transistor has a drain terminal electrically coupled to the second terminal of the NAND-type compare circuit and a gate terminal that may be responsive to the first precharge signal.

BRIEF DESCRIPTION OF THE DRAWINGS

FIGS. 3A-3B are electrical schematics of NAND-type compare circuits according to embodiments of the present invention.

DETAILED DESCRIPTION OF PREFERRED EMBODIMENTS

Figure 1A:
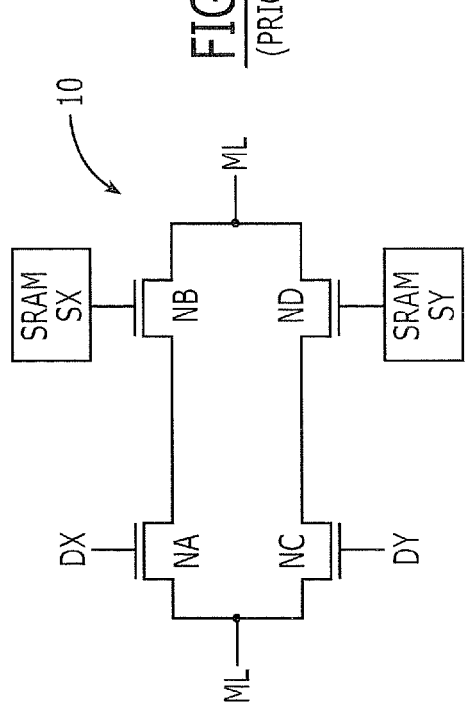
FIG. 1A is a simplified electrical schematic of a conventional ternary NAND CAM cell.
Figure 1B:
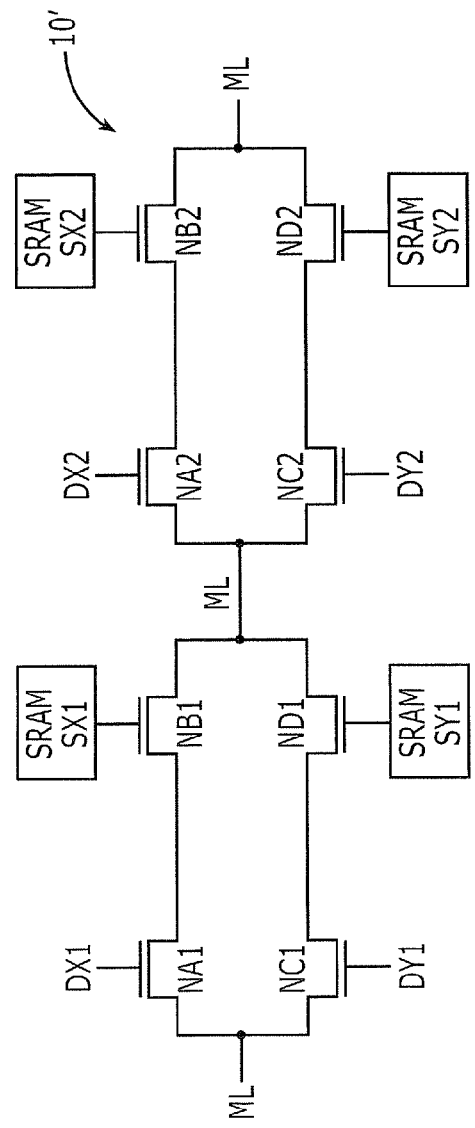
FIG. 1B is a simplified electrical schematic of a pair of the ternary NAND CAM cells of FIG. 1A.
Figure 2A:
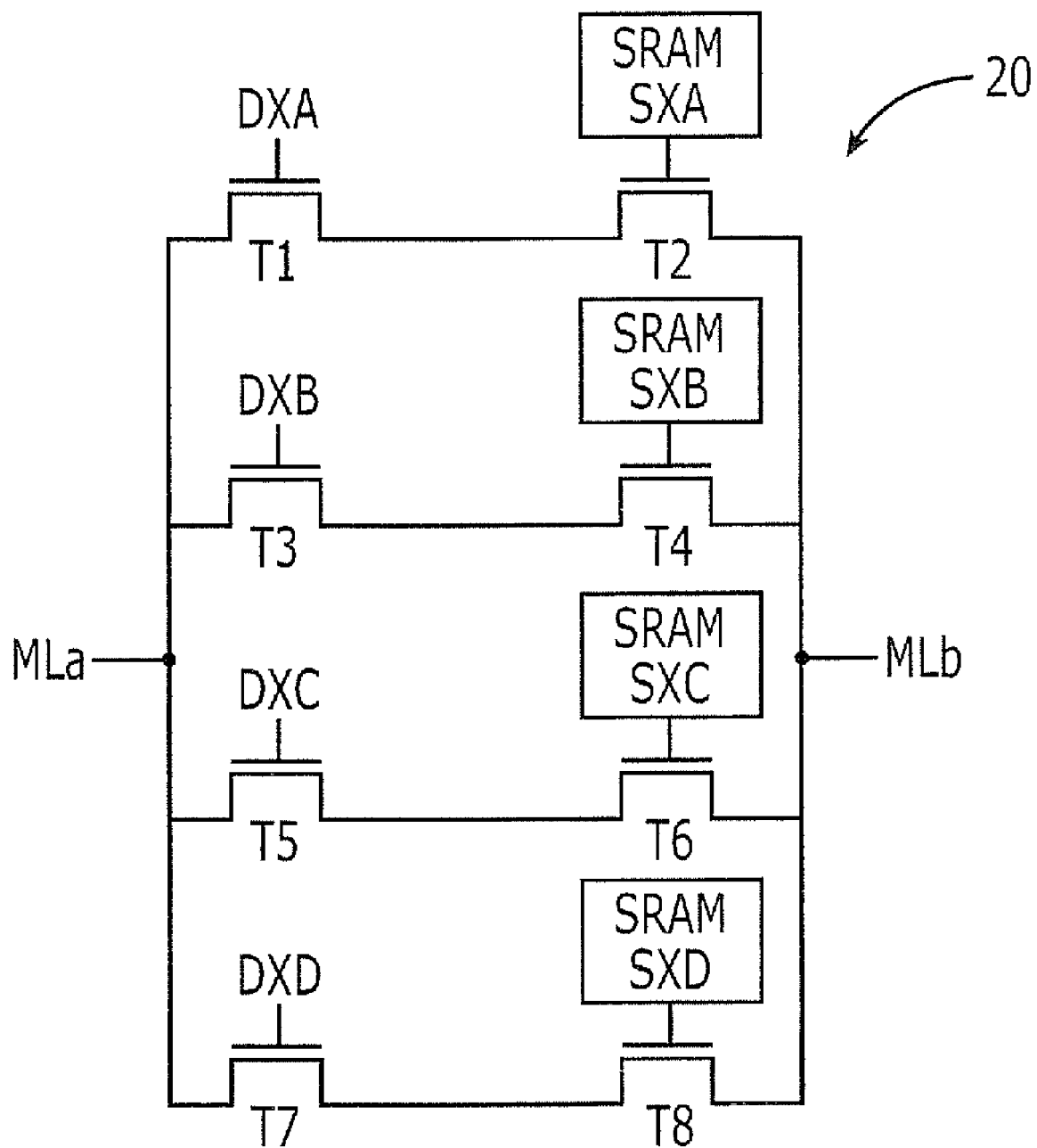
FIG. 2A is a simplified electrical schematic of a conventional NAND-type CAM cell.
Figure 2B:
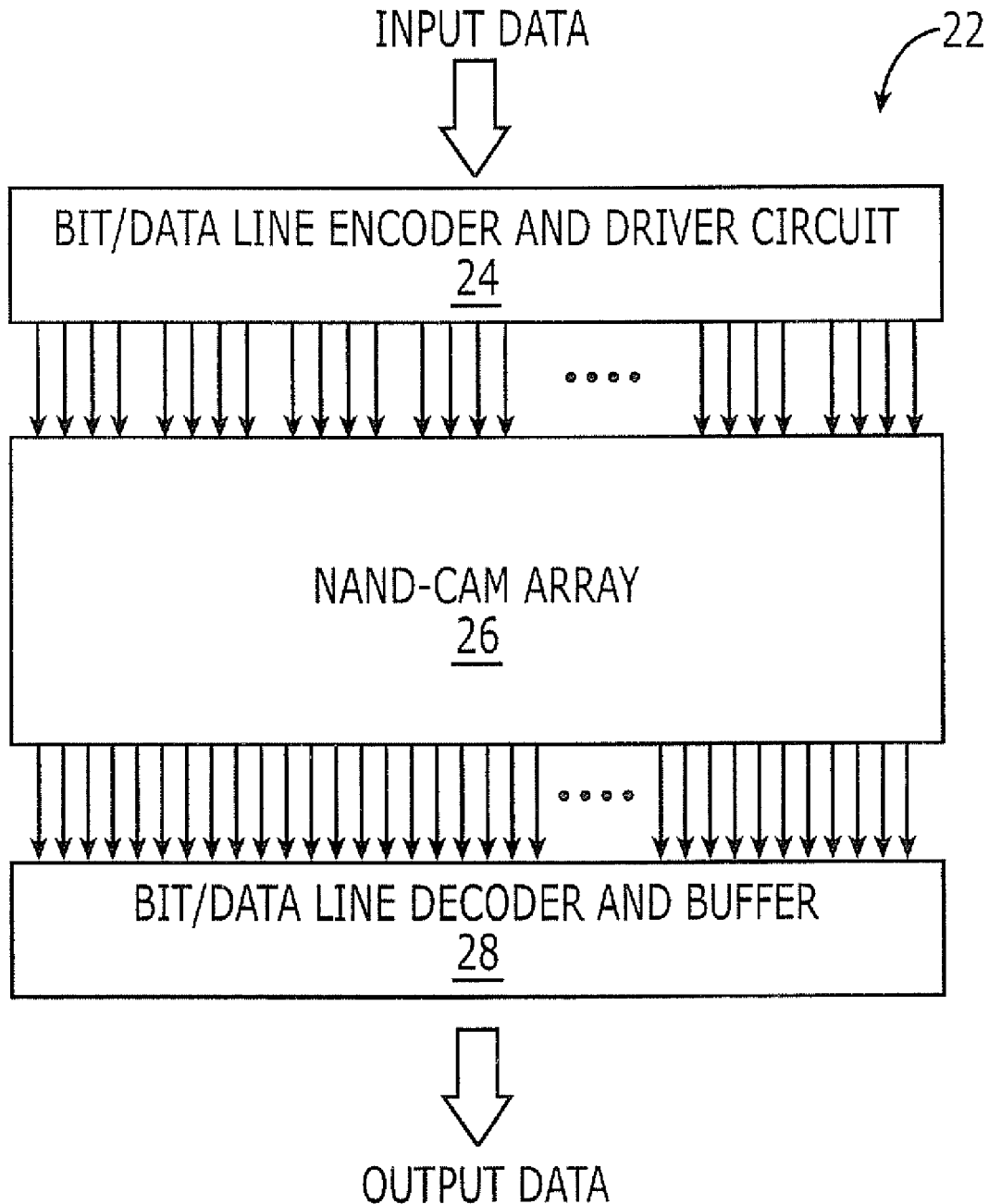
FIG. 2B is a block diagram of a conventional CAM system.

The present invention now will be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout and signal lines and signals thereon may be referred to by the same reference characters. Signals may also be synchronized and/or undergo minor boolean operations (e.g., inversion) without being considered different signals. The overstrike symbol "" (or prefix symbol "/") to a signal name may also denote a complementary data or information signal or an active low control signal, for example.

FIG. 3A illustrates one embodiment of a 4-bit NAND-type compare circuit 30 of a CAM array, which is responsive to first and second operands. The first operand is illustrated as K<3:0>, /K<3:0>, which includes true and complementary bits of an applied search key (K). The second operand is illustrated as D<3:0>, /D<3:0>, which includes true and complementary bits of a stored search word/entry (D) within the CAM array. The NAND-type compare circuit 30 includes a first string of NMOS transistors connected end-to-end in series from a first terminal to a second terminal. This first string of NMOS transistors has gate terminals responsive to the first operand: K3, /K3, K2, /K2, K1, /K1, K0, /K0. The first terminal is electrically coupled to a non-match signal line (NM) and a drain terminal of a PMOS pull-up transistor PU. The second terminal is electrically connected to a drain terminal of an NMOS pull-down transistor PD. The NAND-type compare circuit 30 further includes a second string of NMOS transistors connected end-to-end in series from the first terminal to the second terminal. This second string of NMOS transistors has gate terminals responsive to the second operand: D3, /D3, D2, /D2, D1, /D1, D0, /D0.

The pull-up transistor PU and pull-down transistor PD have gate terminals responsive to an active low precharge signal /PCHG. This active low precharge signal /PCHG operates to precharge the non-match signal line (NM) when held at a logic "0" level. The active low precharge signal /PCHG may also operate to partially precharge intermediate nodes of the compare circuit 30 by setting the first operand to a global mask condition during a precharge time interval. This global mask condition is achieved by setting the first operand so that K<3,0>=1111 and /K<3,0>=1111.

A low-to-high transition of the precharge signal /PCHG enables the compare circuit 30 to switch from a precharge mode of operation, which causes the non-match signal line NM to be pulled high (to Vdd), to a compare mode of operation. During this compare mode of operation, the non-match signal line NM will be pulled low whenever the first and second operands match and remain high when a non-match condition is present. Accordingly, each non-match signal line NM of a compare circuit 30 can be provided to an input terminal of a multi-input OR gate so that multiple compare circuits 30 can grouped together to support a relatively large key size. In some cases, this multi-input OR gate may be configured by passing each signal on a non-match signal line to an inverter having an output connected to an input terminal of a multi-input NAND gate.

As further illustrated by FIG. 3A, the source and drain terminals of the NMOS transistors in the second string are connected to corresponding source and drain terminals of the first string of transistors such that each source terminal of an NMOS transistor in the second string is electrically shorted to at least one source terminal of an NMOS transistor in the first string and each drain terminal of a transistor in the second string is electrically shorted to at least one drain terminal of a transistor in the first string. These electrical shorts are provided at intermediate nodes N0, N1, N2, . . . , N7.

FIG. 3B illustrates another embodiment of a 4-bit NAND-type compare circuit 30' of a CAM array, which is electrically equivalent to the compare circuit 30 of FIG. 3A. However, in contrast to the compare circuit 30 of FIG. 3A, the compare circuit 30' of FIG. 3B includes a first string of transistors that have a first zig-zag layout arrangement (see dotted line) and a second string of transistors that have a second layout arrangement, which is a mirror-image of the first layout arrangement. The first string of transistors includes those NMOS transistors having gate terminals responsive to the first operand: K3, /K3, K2, /K2, K1, /K1, K0, /K0 and the second string of transistors includes those NMOS transistors having gate terminals responsive to the second operand: D3, /D3, D2, /D2, D1, /D1, D0, /D0.

Figure 3C:
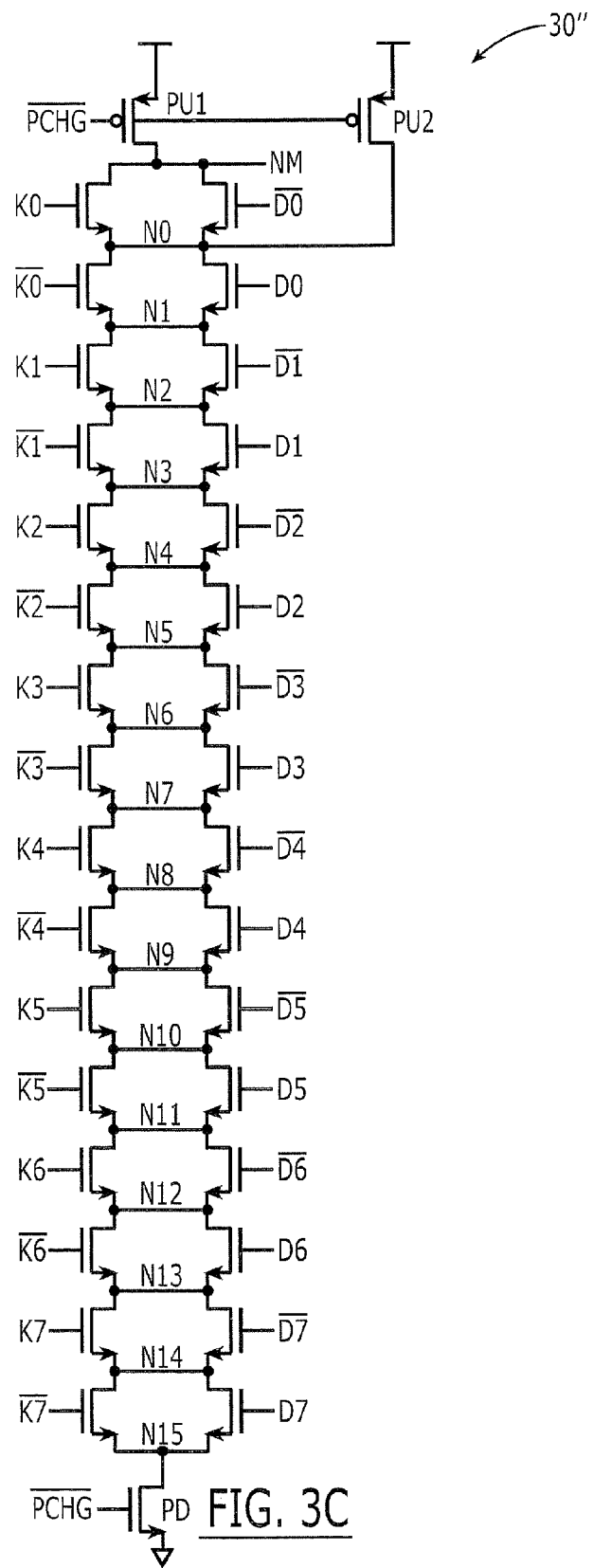
FIG. 3C is an electrical schematic of a NAND-type compare circuit according to embodiments of the present invention.

FIG. 3C illustrates an embodiment of an 8-bit NAND-type compare circuit 30" having first and second strings of NMOS transistors. The first string of NMOS transistors has gate terminals responsive to a first operand K<7:0>, /K<7:0> and the second string of NMOS transistors has gate terminals responsive to a second operand D<7:0>, /D<7:0>. The source and drain terminals of the NMOS transistors in the second string are connected to corresponding source and drain terminals of the first string of transistors such that each source terminal of an NMOS transistor in the second string is electrically shorted to at least one source terminal of an NMOS transistor in the first string and each drain terminal of a transistor in the second string is electrically shorted to at least one drain terminal of a transistor in the first string. These electrical shorts are provided at intermediate nodes N0, N1, N2, N3, . . . , N15.

The compare circuit 30" includes a first pull-up transistor PU1 that is configured to precharge the first terminal and the non-match signal line NM. At least one second pull-up transistor PU2 is also provided to precharge an internal node of the compare circuit 30". This internal node is illustrated as node N0, however, in alternative embodiments, the second pull-up transistor(s) PU2 may be connected to another node(s). This second pull-up transistor PU2 is added to reduce the adverse effects of charge sharing between internal nodes of the NAND-type compare circuit 30". These adverse effects include operation failure caused by a reduction in a voltage on the non-match signal line NM when a non-match condition is present. This reduction of the voltage on the non-match signal line NM may be perceived erroneously as a match condition.

The first and second pull-up transistors PU1 and PU2 may have gate terminals responsive to the active low precharge signal /PCHG. This precharge signal /PCHG may be used to at least partially precharge all intermediate nodes N0, N1, . . . , N15 of the compare circuit 30" by setting the first operand to a global mask condition during a precharge time interval. This global mask condition is achieved by setting the first operand so that K<7,0>=11111111 and /K<7,0>=11111111.

Each of the NAND-type compare circuits 30-30" of FIGS. 3A-3C performs the bit-by-bit encoding illustrated by TABLE 1.

TABLE 1

| BIT | ENCODING |
| --- | --- |
| 0 | (0, 1) |
| 1 | (1, 0) |
| DON'T CARE "*" | (1, 1) |
| DISABLE "^" | (0, 0) |

Based on the encoding of TABLE 1, a global mask condition may be established in a column of a CAM array by setting an nth bit of the first operand to a don't care condition, i.e., Kn=1, /Kn=1. A local mask condition may be established in a CAM cell within a CAM array by programming the CAM cell so that D=1 and /D=1. A plurality of CAM cells within a row of the CAM array may also be disabled by setting D=0 and /D=0 for a plurality of CAM cells within a row having multiple NAND-type compare circuits therein that generate non-match signals NM to a corresponding OR gate associated with the row. For example, at least one CAM cell may be disabled for each NAND-type compare circuit to thereby prevent the corresponding non-match signal line NM from being pulled high-to-low during a compare (i.e., search) operation. This disabling of the CAM cells operates to invalidate the corresponding CAM entry in the row and remove it from the search path of the CAM device.

Figure 4A:
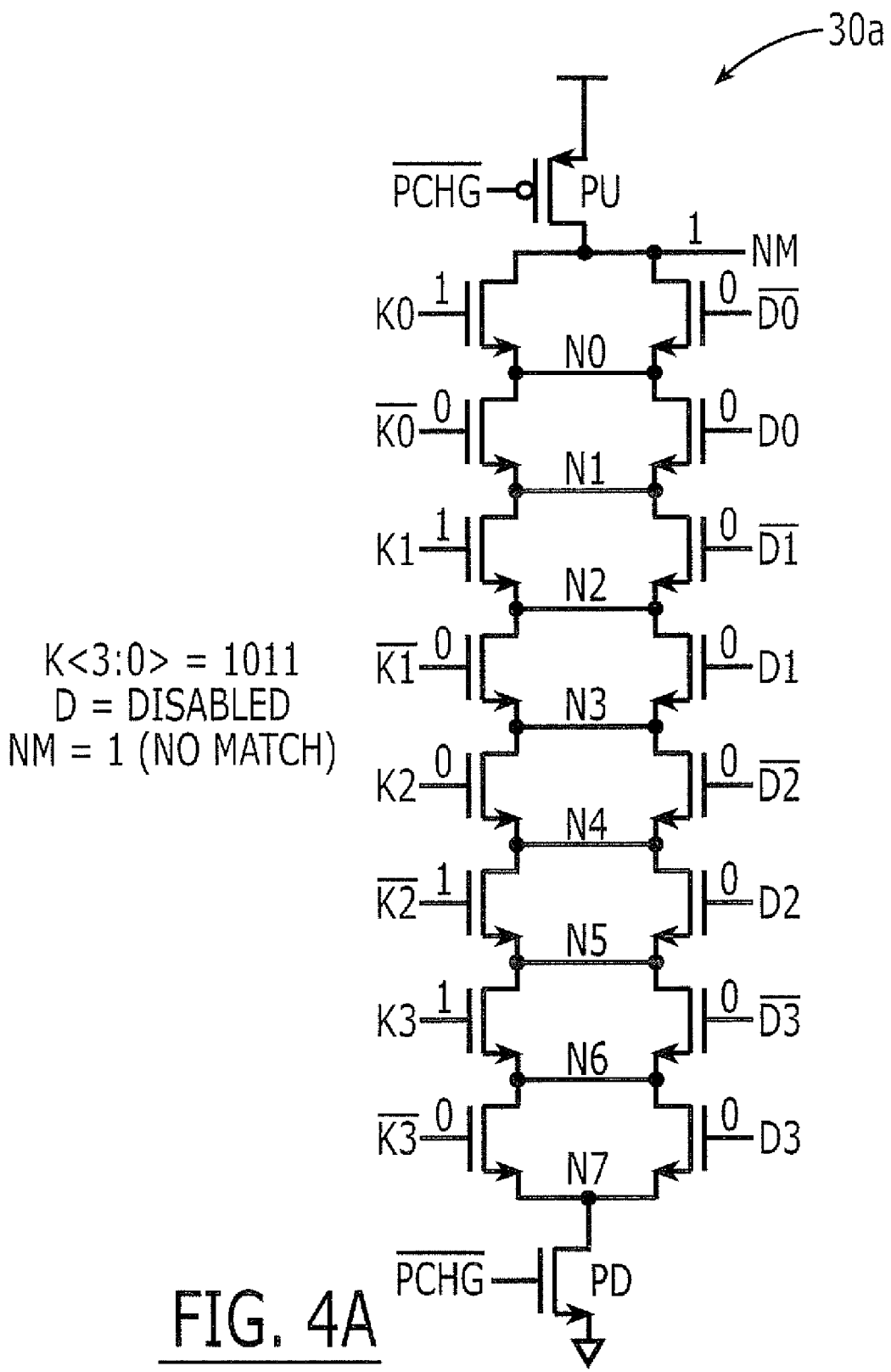
FIGS. 4A-4E are electrical schematics that illustrate operation of the NAND-type compare circuit of FIG. 3A.
Figure 4B:
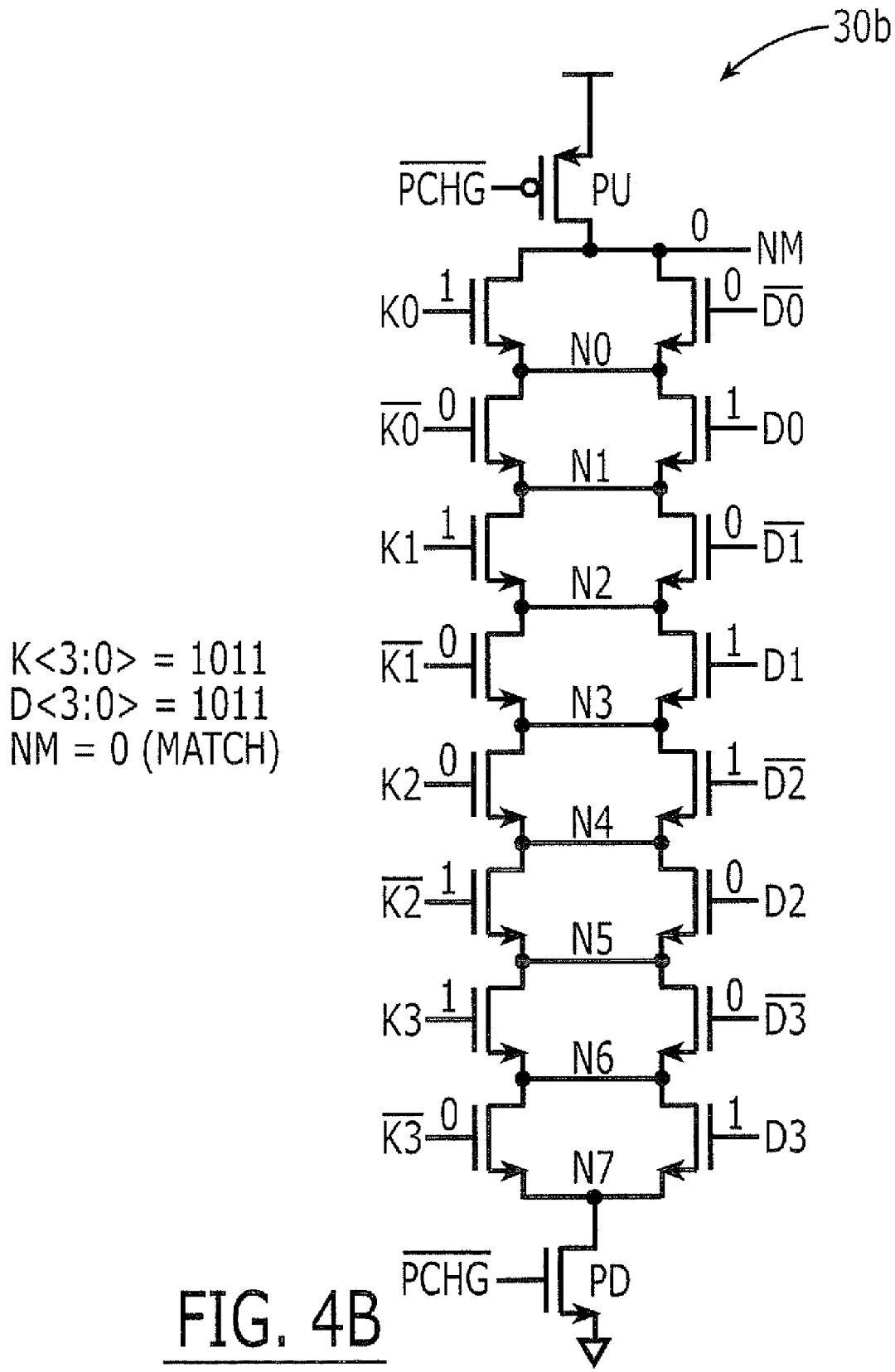

The encoding illustrated by TABLE 1 will now be described more fully with reference to the examples of FIGS. 4A-4E. In particular, FIG. 4A illustrates operations to apply a first operand K<3:0>=1011, /K<3:0>=0100 to a disabled compare circuit 30a, which is electrically coupled to CAM cells (not shown) storing a second "disable" operand D<3:0>=0100, /D<3:0>=0000. In particular, disabling the compare circuit 30a by generating a second operand containing only "0" logic bits causes the non-match signal line NM to remain at a logic "1" precharged level during a compare operation. FIG. 4B illustrates operations to apply a first operand K<3:0>=1011, /K<3:0>=0100 to a compare circuit 30b, which is electrically coupled to CAM cells (not shown) storing a second operand D<3:0>=1011, /D<3:0>=0100. As a result of the equivalency between the first and second operands, the non-match line NM is pulled down to a logic "0" level by the pull-down transistor PD, which is responsive to a precharge signal /PCHG having a logic "1" level.

Figure 4C:
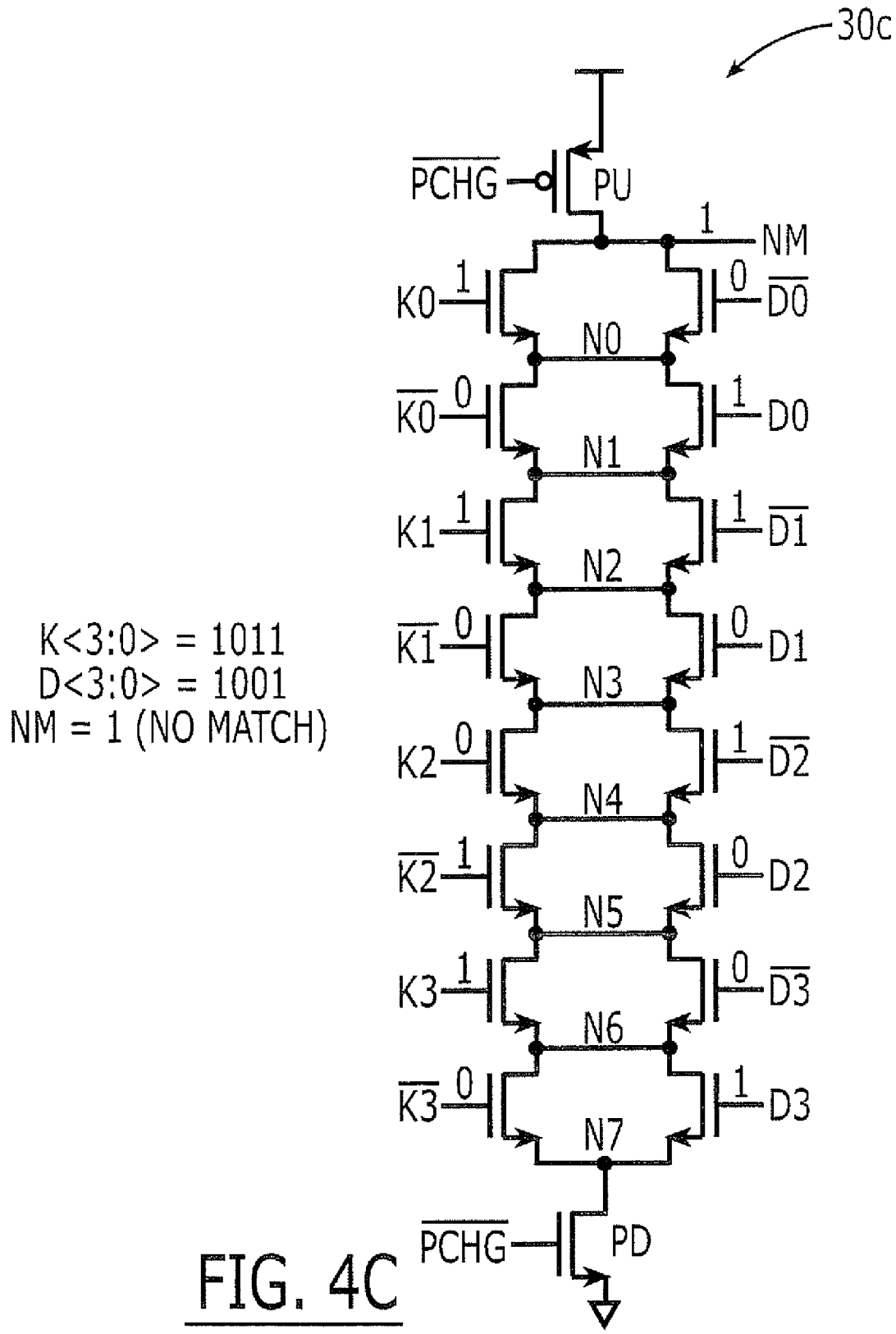
Figure 4D:
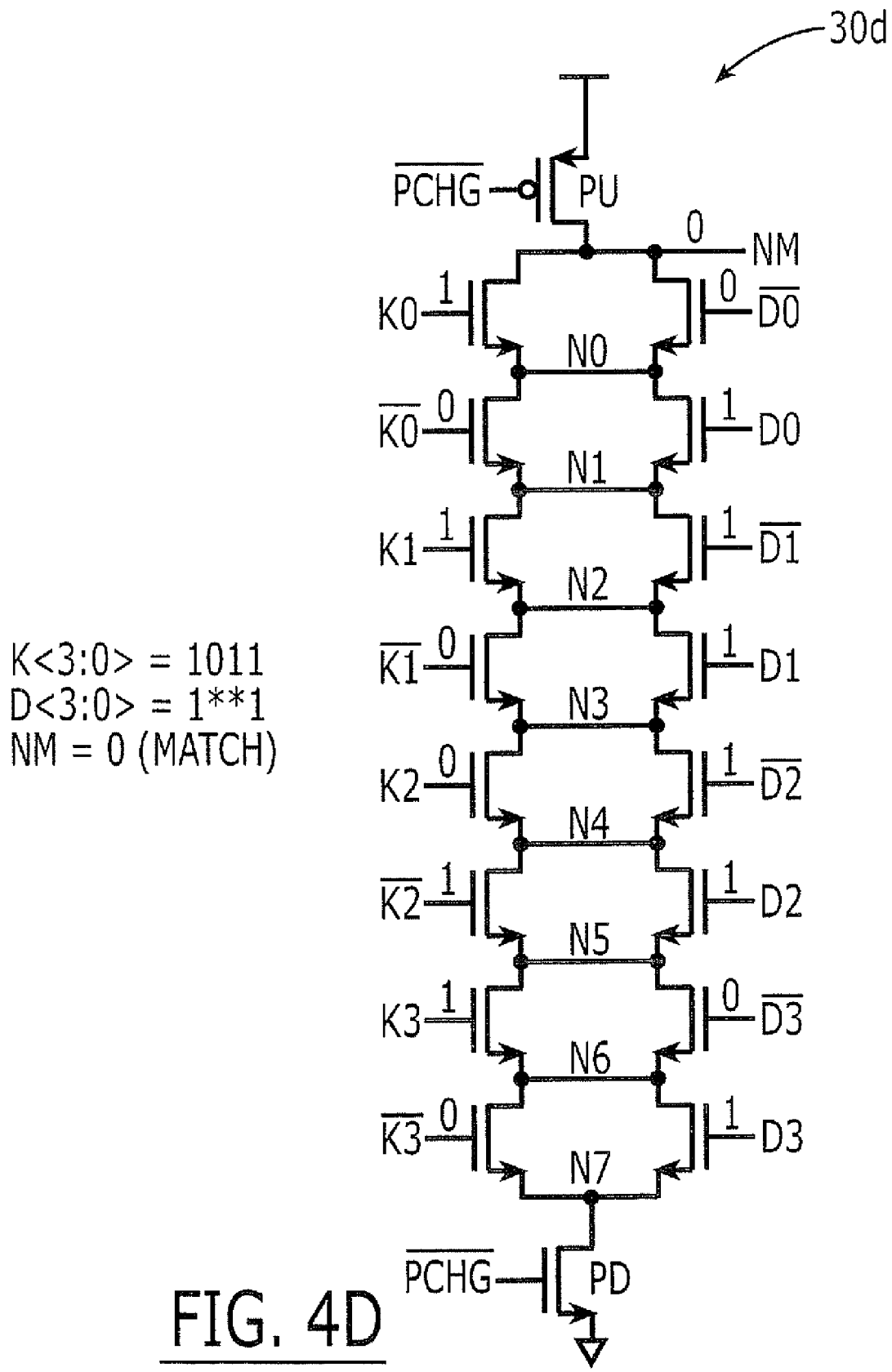
Figure 4E:
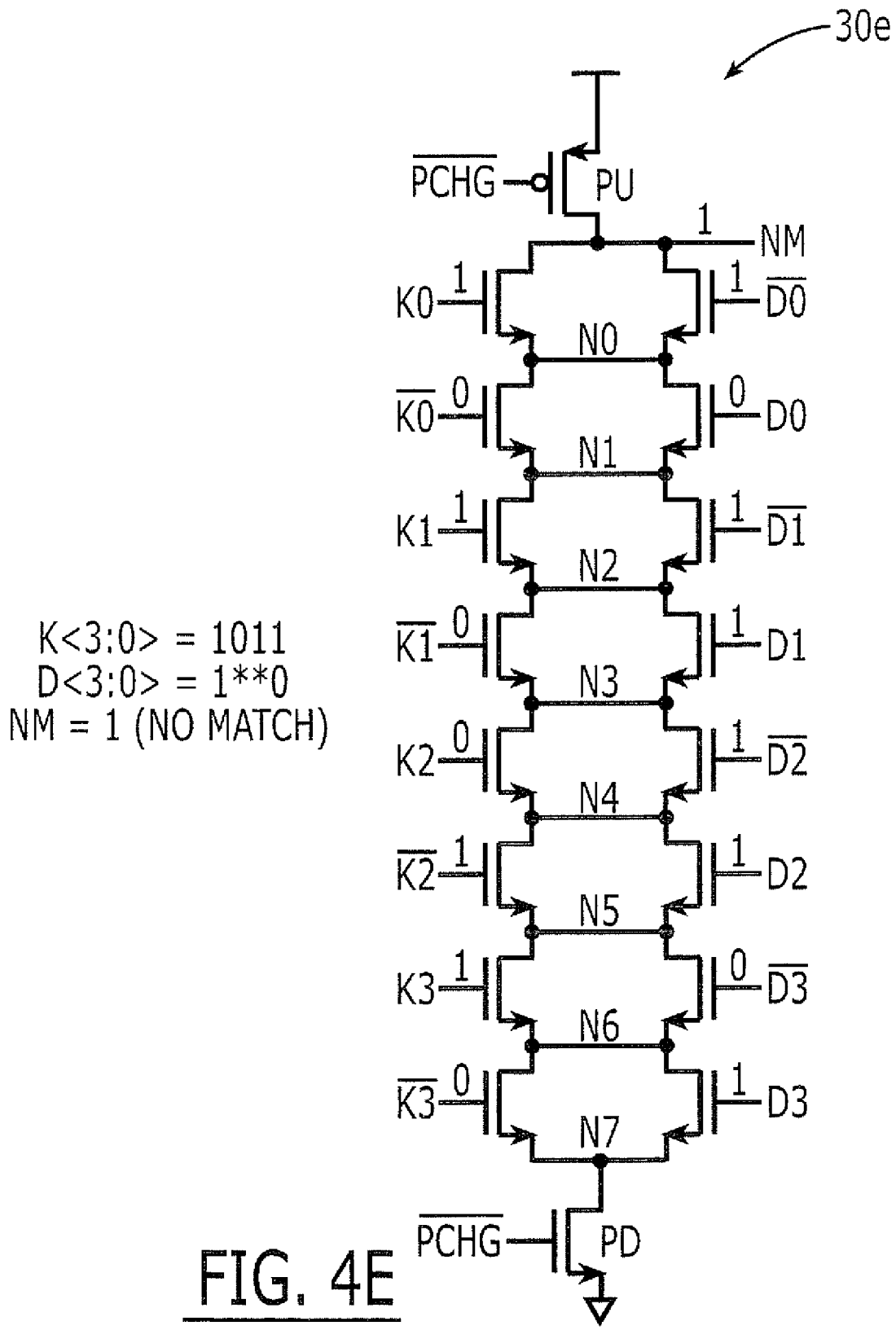

FIG. 4C illustrates operations to apply a first operand K<3:0>=1011, /K<3:0>=0100 to a compare circuit 30c, which is electrically coupled to CAM cells (not shown) storing a second operand D<3:0>=1001, /D<3:0>=0110. As a result of the non-equivalency between the first and second operands, the non-match line NM is held high at a precharged logic "1" level. FIG. 4D illustrates operations to apply a first operand K<3:0>=1011, /K<3:0>=0100 to a compare circuit 30c, which is electrically coupled to CAM cells (not shown) storing a second operand D<3:0>=11, /D<3:0>=00, having two locally masked (i.e., don't care) bits. As a result of the equivalency between the first and second operands, the non-match line NM is pulled down to a logic "0" level by the pull-down transistor PD, which is responsive to a precharge signal /PCHG having a logic "1" level. FIG. 4E illustrates operations to apply a first operand K<3:0>=1011, /K<3:0>=0100 to a compare circuit 30c, which is electrically coupled to CAM cells (not shown) storing a second operand D<3:0>=10, /D<3:0>=01, having two locally masked (i.e., don't care) bits. As a result of the non-equivalency between the first and second operands, the non-match line NM is held high at a precharged logic "1" level.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A content addressable memory (CAM) cell, comprising:
   a NAND-type compare circuit responsive to a first operand containing true and complementary bits of an applied search key and a second operand containing true and complementary bits of a stored search word, said NAND-type compare circuit comprising:
   a first string of transistors connected end-to-end in series from a first terminal to a second terminal, said first string of transistors having gate terminals responsive to the first operand; and
   a second string of transistors connected end-to-end in series from the first terminal to the second terminal, said second string of transistors having gate terminals responsive to the second operand and source and drain terminals connected to corresponding source and drain terminals of said first string of transistors such that each source terminal of a transistor in said second string is electrically shorted to at least one source terminal of a transistor in said first string and each drain terminal of a transistor in said second string is electrically shorted to at least one drain terminal of a transistor in said first string.

2. The CAM cell of claim 1, wherein said NAND-type compare circuit further comprises:
   a first pull-up transistor configured to precharge the first terminal of said NAND-type compare circuit in response to a first precharge signal; and
   a second pull-up transistor configured to precharge a node in said NAND-type compare circuit that is electrically connected a pair of source and drain terminals in said first string of transistors and a pair of source and drain terminals in said second string of transistors.

3. The CAM cell of claim 2, wherein said second pull-up transistor has a gate terminal responsive to the first precharge signal.

4. The CAM cell of claim 2, wherein said NAND-type compare circuit further comprises:
   a pull-down transistor having a drain terminal electrically coupled to the second terminal of said NAND-type compare circuit.

5. The CAM cell of claim 4, wherein said pull-down transistor has a gate terminal responsive to the first precharge signal.

6. A content addressable memory (CAM) cell, comprising:
   a NAND-type compare circuit responsive to a first operand containing true and complementary bits of an applied search key and a second operand containing true and complementary bits of a stored search word, said NAND-type compare circuit comprising:
   a first string of transistors connected end-to-end in series from a first terminal to a second terminal, said first string of transistors having gate terminals responsive to the first operand; and
   a second string of transistors connected end-to-end in series from the first terminal to the second terminal, said second string of transistors having gate terminals responsive to the second operand;
   a first pull-up transistor configured to precharge the first terminal of said NAND-type compare circuit in response to a first precharge signal;
   a second pull-up transistor configured to precharge a node in said NAND-type compare circuit that is electrically connected a pair of source and drain terminals in said first string of transistors and a pair of source and drain terminals in said second string of transistors; and
   a pull-down transistor having a drain terminal electrically coupled to the second terminal of said NAND-type compare circuit.

7. The CAM cell of claim 6, wherein said second pull-up transistor has a gate terminal responsive to the first precharge signal.

8. The CAM cell of claim 7, wherein said pull-down transistor has a gate terminal responsive to the first precharge signal.

* * * * *